US010283665B2

(12) United States Patent
Huang et al.

(10) Patent No.: US 10,283,665 B2
(45) Date of Patent: May 7, 2019

(54) COMPENSATED PHOTONIC DEVICE STRUCTURE AND FABRICATION METHOD THEREOF

(71) Applicant: SiFotonics Technologies Co., Ltd., Grand Cayman (KY)

(72) Inventors: Mengyuan Huang, Beijing (CN); Su Li, Beijing (CN); Tzung-I Su, Taoyuan (TW); Pengfei Cai, Beijing (CN); Wang Chen, Beijing (CN); Ching-yin Hong, Lexington, MA (US); Dong Pan, Andover, MA (US)

(73) Assignee: SiFotonics Technologies Co., Ltd., Grand Cayman (KY)

( * ) Notice: Subject to any disclaimer, the term of this patent is extended or adjusted under 35 U.S.C. 154(b) by 0 days.

(21) Appl. No.: 15/613,133

(22) Filed: Jun. 2, 2017

(65) Prior Publication Data

US 2017/0271543 A1 Sep. 21, 2017

Related U.S. Application Data

(63) Continuation-in-part of application No. 14/326,250, filed on Jul. 8, 2014, now Pat. No. 9,698,296.

(60) Provisional application No. 61/957,627, filed on Jul. 8, 2013.

(51) Int. Cl.
*H01L 31/109* (2006.01)
*H01L 31/0376* (2006.01)
(Continued)

(52) U.S. Cl.
CPC ...... *H01L 31/109* (2013.01); *H01L 31/02161* (2013.01); *H01L 31/022408* (2013.01);
(Continued)

(58) Field of Classification Search
CPC ........................ H01L 31/02161; H01L 31/109
See application file for complete search history.

(56) References Cited

U.S. PATENT DOCUMENTS 5,371,380 A * 12/1994 Saito .................. H01L 29/1604 136/258
6,399,411 B1 * 6/2002 Hori ...................... C23C 14/562 118/718

(Continued)

FOREIGN PATENT DOCUMENTS

WO WO-2017019013 A1 * 2/2017 ............... G02B 6/12

OTHER PUBLICATIONS

Capasso et. al. "AlGaAs/GaAs Staircase Avalanche Photodiodes with high and extremely uniform avalanche gain", IEEE, Electron Devices Meeting, 1988, San Francisco, CA, USA, USA.*

*Primary Examiner* — Sitaramarao S Yechuri
(74) *Attorney, Agent, or Firm* — Han IP PLLC; Andy M. Han

(57) ABSTRACT

Various embodiments of a compensated photonic device structure and fabrication method thereof are described herein. A photonic device may include a silicon-on-insulator (SOI) substrate with a buried oxide (BOX) layer therein, a Si waveguide and an n-type contact layer formed on the BOX layer, a Si multiplication layer disposed on the n-type contact layer, a p-type Si charge layer disposed on the Si multiplication layer, a germanium (Ge) absorption layer disposed on the p-type Si charge layer, a p-type contact layer disposed on the Ge absorption layer, and a metal layer disposed on the p-type contact layer. A compensated region may be formed between the p-type Si charge layer and the Ge absorption layer with a portion of the compensated region in the p-type Si charge layer and another portion of the compensated region in the Ge absorption layer.

14 Claims, 4 Drawing Sheets

100

190
180
170
160
150
140
130
120
114
112
Incident Optical Beam
Si WG
110

(51) Int. Cl.

| | |
|---|---|
| ***H01L 31/0224*** | (2006.01) |
| ***H01L 31/20*** | (2006.01) |
| ***H01L 31/0216*** | (2014.01) |
| ***H01L 31/105*** | (2006.01) |
| ***H01L 31/107*** | (2006.01) |

(52) U.S. Cl.

CPC ...... *H01L 31/03762* (2013.01); *H01L 31/105* (2013.01); *H01L 31/1075* (2013.01); *H01L 31/204* (2013.01); *H01L 31/208* (2013.01)

(56) References Cited

U.S. PATENT DOCUMENTS

| | | | | |
|---|---|---|---|---|
| 7,616,904 | B1 * | 11/2009 | Gunn, III | H01L 31/109 257/431 |
| 2001/0035540 | A1 * | 11/2001 | Sugiyama | H01L 31/02005 257/226 |
| 2006/0207651 | A1 * | 9/2006 | Posthuma | H01L 31/022425 136/261 |
| 2006/0289957 | A1 * | 12/2006 | Morse | H01L 31/028 257/438 |
| 2007/0152289 | A1 * | 7/2007 | Morse | H01L 31/028 257/431 |
| 2012/0025195 | A1 * | 2/2012 | McComber | C23C 16/04 257/65 |
| 2015/0325736 | A1 * | 11/2015 | Knoll | H01L 31/02327 257/432 |
| 2016/0043262 | A1 * | 2/2016 | Okumura | H01L 31/105 257/184 |
| 2018/0219120 | A1 * | 8/2018 | Huang | G02B 6/12 |

* cited by examiner

COMPENSATED PHOTONIC DEVICE STRUCTURE AND FABRICATION METHOD THEREOF

CROSS-REFERENCE TO RELATED PATENT APPLICATIONS

The present disclosure is part of a continuation-in-part (CIP) of U.S. patent application Ser. No. 14/326,250, filed on Jul. 8, 2014 and claiming the priority benefit of U.S. Patent Application No. 61/957,627, filed on Jul. 8, 2013. The aforementioned applications are incorporated by reference in its entirety.

TECHNICAL FIELD

The present disclosure relates to photonic devices. More particularly, the present disclosure relates to a compensated photonic device structure and fabrication method thereof.

BACKGROUND

For heterojunction photonic devices, such as Ge/Si photodiodes or GaAs/Si photodiodes, some defect states are located around the interface. These defect states usually have an energy level of 0.06V above the valence band (acceptor) with a density range of $10^{11}$~$10^{13}$ $cm^{-2}$. Because of the existence of such defect energy states, the region is more difficult to be depleted compared to intrinsic material, and it requires a higher applied bias for photodiode or avalanche photodiode operation. For high-speed device such as 25-GHz devices (25G) or beyond, such higher applied bias is undesirable and unacceptable. Moreover, high applied bias causes high electric field in this region, which will lead to high leakage current. Moreover, for high speed operations such as 25G or beyond, the absorption layer becomes very thin to ensure high bandwidth operations, thus the optical absorption becomes very low.

SUMMARY

This section highlights certain features of the inventive concept of the present disclosure, and in no way is to be interpreted as limiting the scope of the claimed subject matter as well as any deviations and derivatives thereof.

In one aspect, a compensated photonic device in accordance with the present disclosure may include a silicon on insulator (SOI) substrate with a buried oxide (BOX) layer therein, a Si waveguide and an n-type contact layer formed on the BOX layer, a Si multiplication layer disposed on the n-type contact layer, a p-type Si charge layer formed on the Si multiplication layer, a germanium (Ge) absorption layer disposed on the p-type Si charge layer, a p-type contact layer disposed on the Ge absorption layer, and a metal layer disposed on the p-type contact layer. A compensated region may be formed between the p-type Si charge layer and the Ge absorption layer with a portion of the compensated region in the p-type Si charge layer and another portion of the compensated region in the Ge absorption layer.

In another aspect, a method of fabricating a compensated photonic device may involve: preparing a silicon-on-insulator (SOI) wafer, etching a top Si layer of SOI wafer and stopping the etching at a surface a buried oxide (BOX) layer; forming a Si waveguide and implanting some region of top silicon with n-type dopants to form an n-type contact layer on the BOX layer; depositing an oxide layer and performing chemical mechanical polishing (CMP); etching the oxide layer above the n-type contact layer and selectively depositing intrinsic Si on the n-type contact layer; implanting p-type dopants to form a p-type Si charge layer; depositing a Ge absorption layer on the p-type Si charge layer with a compensated region formed between the Ge absorption layer and the p-type Si charge layer; depositing an intrinsic amorphous Si layer on the Ge absorption layer; implanting the intrinsic amorphous Si layer with p-type dopants to form a p-type contact layer; performing silicide formation and metallization to form a metal layer on the p-type contact layer; and depositing one or more passivation layers.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Example Embodiments

To solve the aforementioned problems, the present disclosure provides a compensated photonic device structure and fabrication method thereof.

Figure 1:
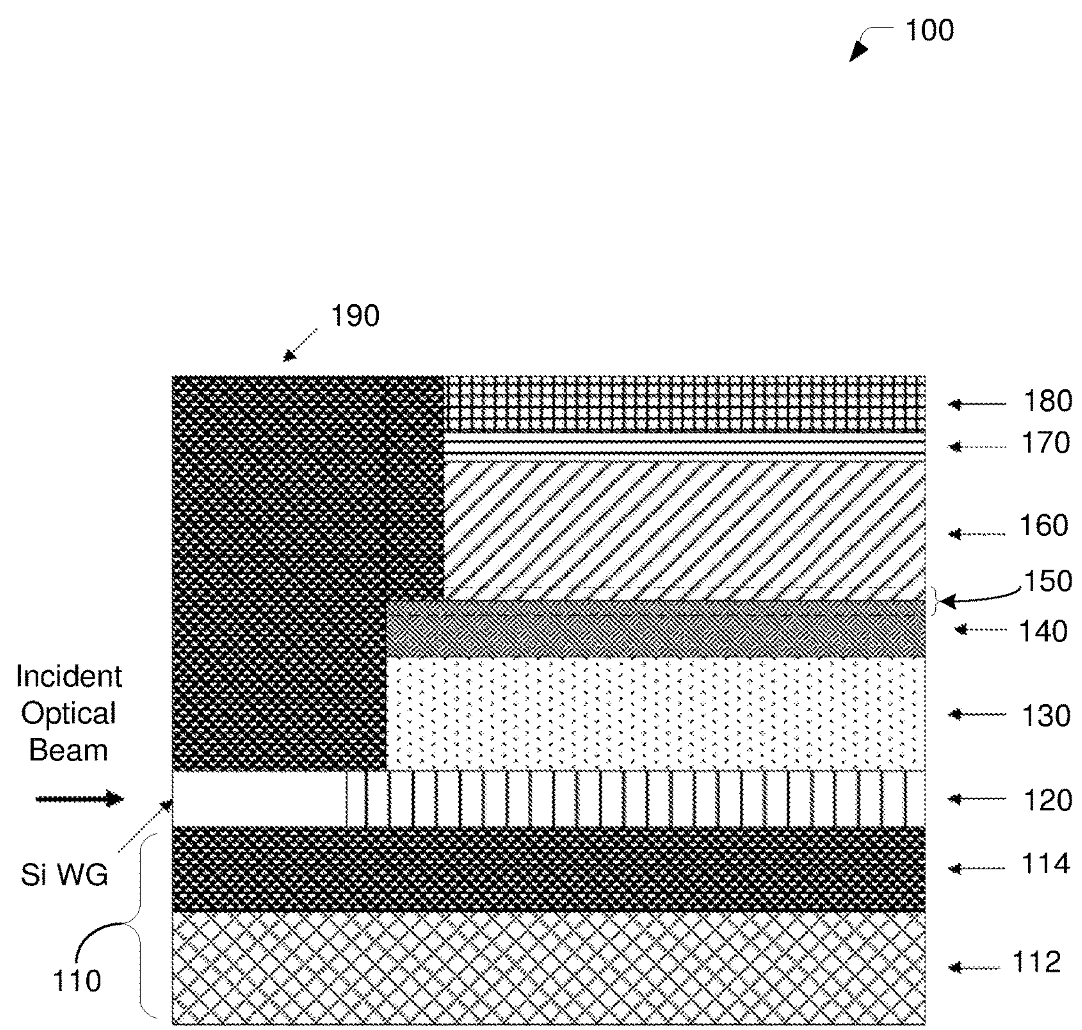
FIG. 1 is a cross-sectional view of a compensated photonic device in accordance with an embodiment of the present disclosure.

FIG. 1 is a cross-sectional view of a compensated photonic device 100 in accordance with an embodiment of the present disclosure. Compensated photonic device 100 may be, for example and without limitation, a waveguide Ge/Si avalanche photodiode (APD). Different from conventional structures, the structure of compensated photonic device 100 may include at least a substrate 110 with a silicon (Si) waveguide (WG) and an n-type contact layer 120 disposed thereon. Substrate 110 may be made of Si or other suitable materials. In some embodiments, substrate 110 may be a silicon-on-insulator (SOI) substrate including a Si substrate 112 and a buried oxide (BOX) layer disposed on Si substrate 112. In some embodiments, n-type contact layer 120 may include heavily-doped Si with n-type dopants. Compensated photonic device 100 may also include a Si multiplication layer 130 disposed on n-type contact layer 120, a p-type Si charge layer 140 disposed on Si multiplication layer 130, a germanium (Ge) absorption layer 160 disposed on p-type Si charge layer 140, a p-type contact layer 170 disposed on Ge absorption layer 160, and a metal contact layer 180 disposed on p-type contact layer 170.

In some embodiments, compensated photonic device 100 may include a compensated region 150 between p-type Si charge layer 140 and Ge absorption layer 160. Specifically, compensated region 150 may be formed at the interface between p-type Si charge layer 140 and Ge absorption layer 160, with a portion of compensated region 150 in p-type Si charge layer 140 and another portion of compensated region 150 in Ge absorption layer 160. In some embodiments, compensated region 150 may include slight doping of n-type dopants.

In some embodiments, p-type Si charge layer 140 may include lightly-doped Si with p-type dopants. In some embodiments, Ge absorption layer 160 may include intrinsic Ge. In some embodiments, p-type contact layer 170 may include heavily-doped amorphous Si with p-type dopants. In some embodiments, metal contact layer 180 may include tungsten or aluminum.

In some embodiments, compensated photonic device 100 may further include a passivation layer 190. In some embodiments, passivation layer 190 may include oxide or other suitable material such as oxide and silicon nitride. In the example shown in FIG. 1, a portion of passivation layer 190 is disposed on Si WG n-type contact layer 120, and another portion of passivation layer 190 is disposed on p-type Si charge layer 140. Accordingly, passivation layer 190 may be adjacent or next to each of Si multiplication layer 130, compensated region 150, Ge absorption layer 160, p-type contact layer 170 and metal contact layer 180. Moreover, passivation layer 190 may be on the side of compensated photonic device 100 on which an incident optical beam is received by Si WG during operation.

In some embodiments, a thickness of the Ge absorption layer may be in a range between 300 nm and 800 nm. In some embodiments, a concentration of intrinsic carriers in the Ge absorption layer may be in a range between 1e14 $cm^{-3}$ and 1e16 $cm^{-3}$.

In some embodiments, a thickness of the Si multiplication layer may be in a range between 100 nm and 600 nm. In some embodiments, a concentration of intrinsic carriers in the Si multiplication layer may be in a range between 5e13 $cm^{-3}$ and 5e16 $cm^{-3}$.

In some embodiments, a thickness of the Si waveguide may be in a range between 100 nm and 500 nm. In some embodiments, a concentration of intrinsic carriers in the Si waveguide may be in a range between 5e13 $cm^{-3}$ and 5e16 $cm^{-3}$.

In some embodiments, a thickness of the n-type contact layer may be in a range between 100 nm and 500 nm. In some embodiments, a concentration of intrinsic carriers in the n-type contact Si layer may be in a range between 3e18 $cm^{-3}$ and 3e19 $cm^{-3}$.

In some embodiments, a thickness of the BOX layer may be in a range between 1000 nm and 4000 nm.

In some embodiments, a thickness of the compensated region may be in a range between 100 nm and 500 nm. In some embodiments, a concentration of defect-caused p-type may be at least 50% less than that without compensated region.

In some embodiments, a thickness of the p-type contact layer may be in a range between 50 nm and 200 nm. In some embodiments, a concentration of p-type carriers in the p-type contact layer may be in a range between 3e18 $cm^{-3}$ and 3e19 $cm^{-3}$.

Figure 2:
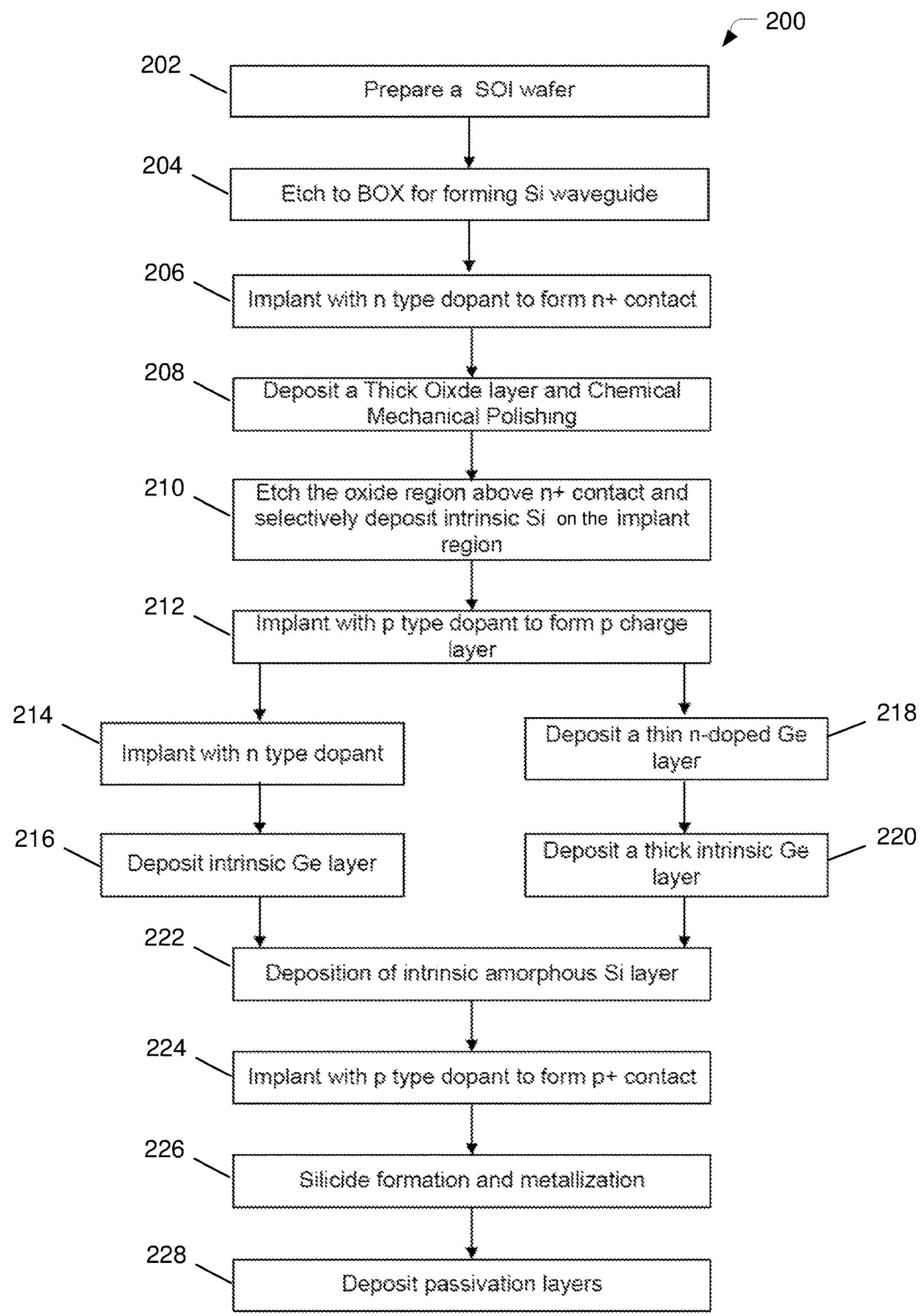
FIG. 2 is a flow chart of a fabrication method of a compensated photonic device in accordance with an embodiment of the present disclosure.

FIG. 2 is a flow chart of a fabrication method 200 of a compensated photonic device in accordance with an embodiment of the present disclosure. Fabrication method 200 may be utilized to fabricate compensated photonic device 100. In summary, an example embodiment of the fabrication method 200 may include the operations shown in FIG. 2 such as 202, 204, 206, 208, 210, 212, 214, 216, 218, 220, 222, 224, 226 and 228. Fabrication method 200 may begin at 202.

At 202, fabrication method 200 may involve preparing a bulk Si or SOI wafer as substrate 110. Fabrication method 200 may proceed from 202 to 204.

At 204, fabrication method 200 may involve etching substrate 110 to BOX layer 114 for forming a Si waveguide layer (hereinafter interchangeably referred as "Si waveguide") thereon. Fabrication method 200 may proceed from 204 to 206.

At 206, fabrication method 200 may involve implanting substrate 110 with n-type dopants to form a heavily-doped contact layer with n-type dopants (n+ contact layer). Fabrication method 200 may proceed from 206 to 208.

At 208, fabrication method 200 may involve depositing a thick oxide layer and performing chemical mechanical polishing (CMP). Fabrication method 200 may proceed from 208 to 210.

At 210, fabrication method 200 may involve etching a region of the oxide layer above the heavily-doped contact layer with n-type dopants (n+ contact layer) as well as selectively depositing intrinsic Si on the implanted region of substrate 110 to form an intrinsic Si multiplication layer. Fabrication method 200 may proceed from 210 to 212.

At 212, fabrication method 200 may involve implanting the intrinsic Si multiplication layer with p-type dopants to form a lightly-doped charge layer with p-type dopants. Fabrication method 200 may proceed from 212 to either 214 or 218.

At 214, fabrication method 200 may involve implanting the p-type charge layer with n-type dopants. Fabrication method 200 may proceed from 214 to 216.

At 216, fabrication method 200 may involve depositing an intrinsic Ge layer on the p-type charge layer. Fabrication method 200 may proceed from 216 to 222.

At 218, fabrication method 200 may involve depositing a thin Ge layer lightly doped with n-type dopants. Fabrication method 200 may proceed from 218 to 220.

At 220, fabrication method 200 may involve depositing a thick intrinsic Ge layer on the thin and lightly-doped Ge layer. Fabrication method 200 may proceed from 220 to 222.

At 222, fabrication method 200 may involve depositing an intrinsic amorphous Si layer on the intrinsic Ge layer. Fabrication method 200 may proceed from 222 to 224.

At 224, fabrication method 200 may involve implanting the intrinsic amorphous Si layer with p-type dopants to form a heavily-doped contact layer with p-type dopants (p+contact layer). Fabrication method 200 may proceed from 224 to 226.

At 226, fabrication method 200 may involve performing silicide formation and metallization on the heavily-doped contact layer with p-type dopants (p+contact layer) to form a metal layer thereon. Fabrication method 200 may proceed from 226 to 228.

At 228, fabrication method 200 may involve depositing one or more passivation layers on the structure.

Figure 3:
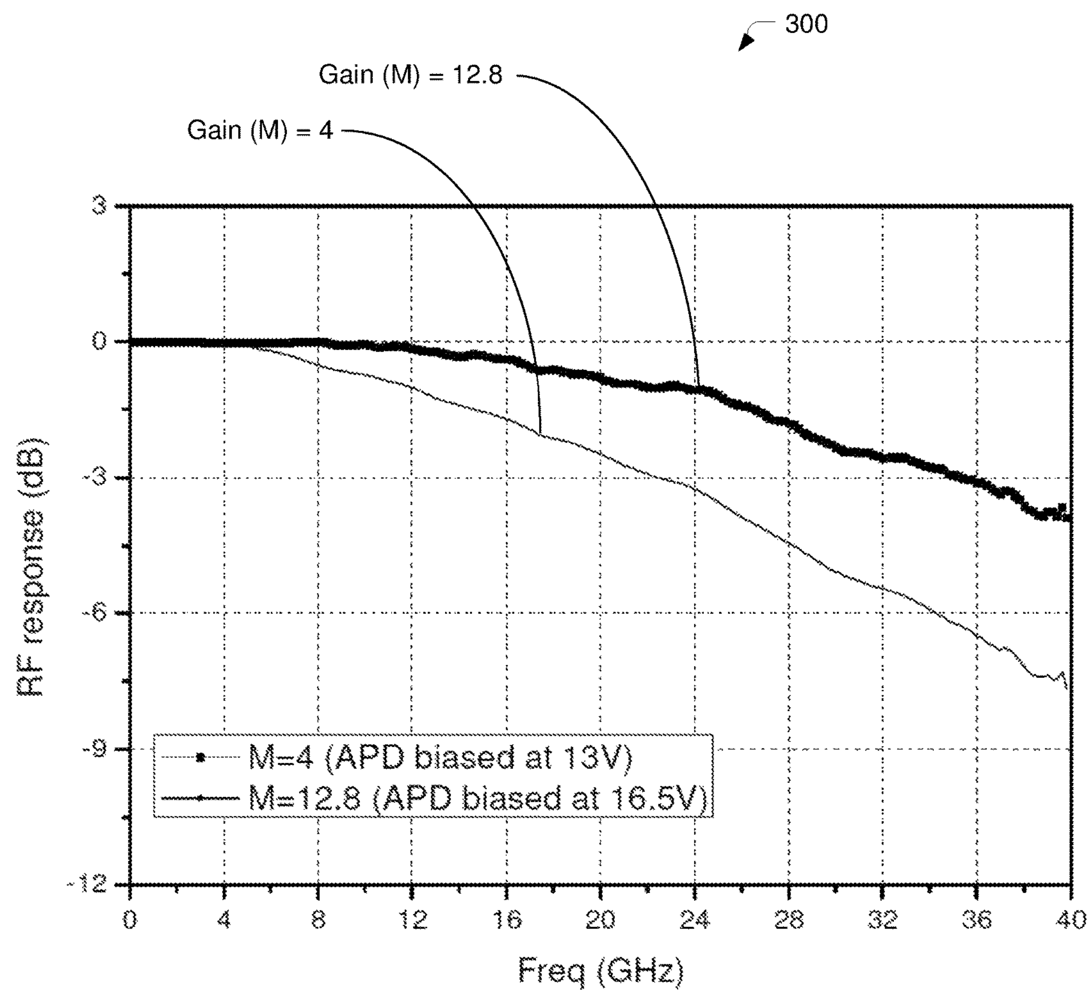
FIG. 3 is a chart showing measured bandwidth of a compensated photonic device in accordance with an embodiment of the present disclosure.

FIG. 3 is a chart 300 showing measured bandwidth of a compensated photonic device in accordance with an embodiment of the present disclosure. Chart 300 shows radio frequency (RF) performance of a waveguide Ge/Si compensated APD in accordance with the present disclosure. Referring to FIG. 3, for APD operating at low gain such as M=4 (with APD biased at 13V), the 3 dB bandwidth is larger than 35.5 GHz. Also referring to FIG. 3, for APD operating at high gain such as M=12.8 (with APD biased at 16.5V), the 3 dB bandwidth is larger than 22.5 GHz.

Figure 4:
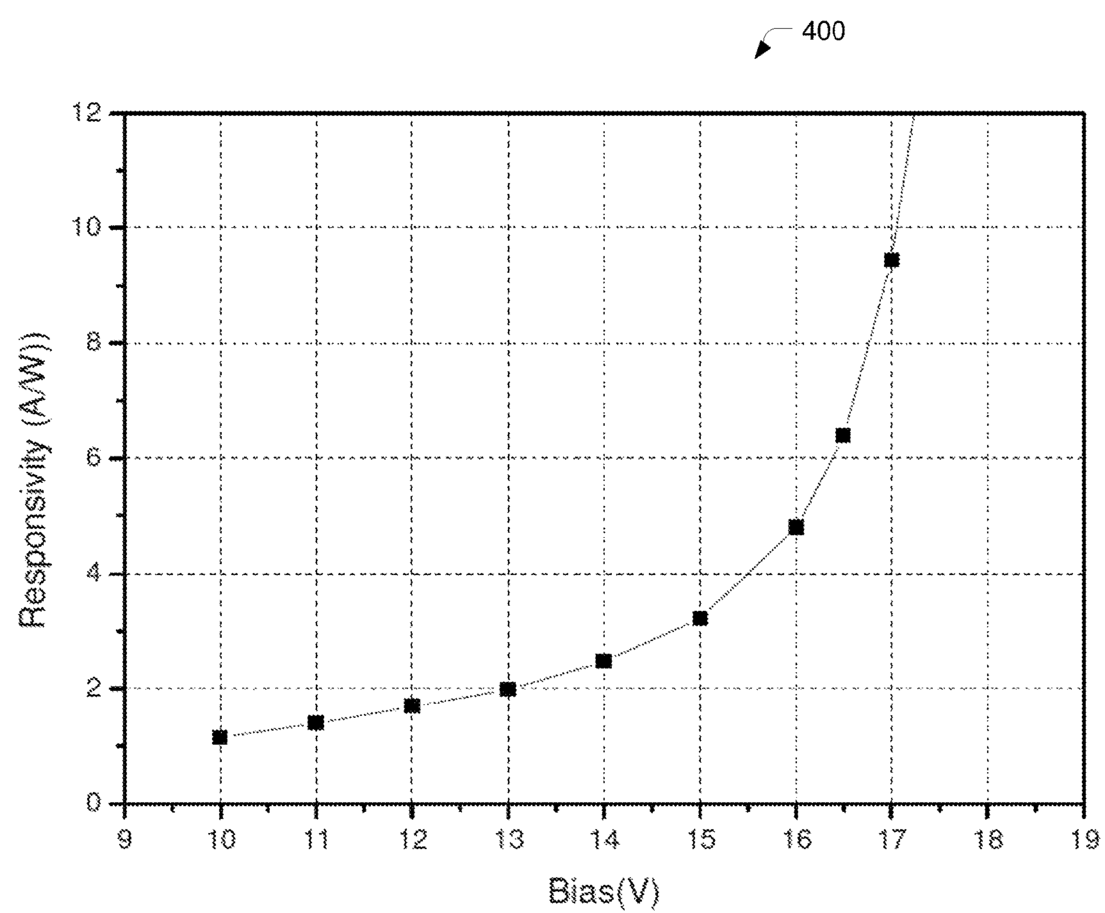
FIG. 4 is a chart showing measured 1550 nm responsivity of a compensated photonic device in accordance with an embodiment of the present disclosure.

FIG. 4 is a chart 400 showing measured 1550 nm responsivity of a compensated photonic device in accordance with an embodiment of the present disclosure. Chart 400 shows 1550 nm responsivity of a compensated waveguide Ge/Si APD in accordance with the present disclosure. Referring to FIG. 4, the responsivity reaches 2 A/W (amperes/watt) at low gain=4 and 6.4 A/W at high gain=12.8 (all these responsivity data including coupling loss). This shows that compensated waveguide Ge/Si APD can reach high responsivity and high bandwidth at the same time.

Highlight of Select Features

In one aspect, a compensated photonic device in accordance with the present disclosure may include a SOI substrate with a BOX layer therein, a top Si layer of SOI wafer etched and implanted to form Si waveguide and an n-type contact layer (etching stopped at the surface on BOX layer), a thick oxide layer is deposited on the Si waveguide and n-type contact layer and CMP processed with the oxide layer etched in a region above the n-type contact layer, a Si multiplication layer disposed on the n-type contact layer, a p-type Si charge layer disposed on the Si multiplication layer, a Ge absorption layer disposed on the p-type Si charge layer, a p-type contact layer disposed on the Ge absorption layer, and a metal layer disposed on the p-type contact layer. A compensated region may be formed between the p-type Si charge layer and the Ge absorption layer with a portion of the compensated region in the p-type Si charge layer and another portion of the compensated region in the Ge absorption layer.

In some embodiments, the n-type contact layer may include Si heavily doped with n-type dopants.

In some embodiments, the Si multiplication layer may include intrinsic Si.

In some embodiments, the p-type Si charge layer may include Si lightly doped with p-type dopants.

In some embodiments, the Ge absorption layer may include intrinsic Ge.

In some embodiments, the p-type contact layer may include amorphous Si heavily doped with p-type dopants.

In some embodiments, the metal layer may include tungsten or aluminum.

In some embodiments, a thickness of the Ge absorption layer may be in a range between 300 nm and 800 nm, and a concentration of intrinsic carriers in the Ge absorption layer may be in a range between 1e14 $cm^{-3}$ and 1e16 $cm^{-3}$.

In some embodiments, a thickness of the Si multiplication layer may be in a range between 100 nm and 600 nm, and a concentration of intrinsic carriers in the Ge absorption layer may be in a range between 5e13 $cm^{-3}$ and 5e16 $cm^{-3}$.

In some embodiments, a thickness of the Si waveguide may be in a range between 100 nm and 500 nm, and a concentration of intrinsic carriers in the Ge absorption layer may be in a range between 5e13 $cm^{-3}$ and 5e16 $cm^{-3}$.

In some embodiments, a thickness of the n-type contact layer may be in a range between 100 nm and 500 nm, and a concentration of intrinsic carriers in the Ge absorption layer may be in a range between 3e18 $cm^{-3}$ and 3e19 $cm^{-3}$.

In some embodiments, a thickness of the BOX layer may be in a range between 1000 nm and 4000 nm.

In some embodiments, a thickness of the compensated region may be in a range between 100 nm and 500 nm, and a concentration of defect-caused p-type may be at least 50% less than that without compensated region.

In some embodiments, a thickness of the p-type contact layer may be in a range between 50 nm and 200 nm, and a concentration of p-type carriers in the p-type contact layer may be in a range between 3e18 $cm^{-3}$ and 3e19 $cm^{-3}$.

In another aspect, a method of fabricating a compensated photonic device may involve: forming a BOX layer in a Si substrate; etching the Si substrate to the BOX layer; forming a Si waveguide and implanting with n-type dopants to form an n-type contact layer on the BOX layer; depositing an oxide layer and performing chemical mechanical polishing; etching the oxide layer above the n-type contact layer and selectively depositing intrinsic Si on the n-type contact layer; implanting p-type dopants to form a p-type Si charge layer; forming a Ge absorption layer on the p-type Si charge layer with a compensated region formed between the Ge absorption layer and the p-type Si charge layer; depositing an intrinsic amorphous Si layer on the Ge absorption layer; implanting the intrinsic amorphous Si layer with p-type dopants to form a p-type contact layer; performing silicide formation and metallization to form a metal layer on the p-type contact layer; and depositing one or more passivation layers.

In some embodiments, the forming of the Ge absorption layer on the p-type Si charge layer with a compensated region formed between the Ge absorption layer and the p-type Si charge layer may involve: implanting the p-type Si charge layer with n-type dopants; and depositing an intrinsic Ge layer on the p-type Si charge layer to form the Ge absorption layer.

Alternatively, the forming of the Ge absorption layer on the p-type Si charge layer with a compensated region formed between the Ge absorption layer and the p-type Si charge layer may involve: depositing a thin n-doped Ge layer on the p-type Si charge layer; and depositing a thick intrinsic Ge layer on the p-type Si charge layer to form the Ge absorption layer.

In some embodiments, a thickness of the Ge absorption layer may be in a range between 300 nm and 800 nm, a concentration of intrinsic carriers in the Ge absorption layer may be in a range between 1e14 $cm^{-3}$ and 1e16 $cm^{-3}$, a thickness of the Si multiplication layer may be in a range between 100 nm and 600 nm, a concentration of intrinsic carriers in the Ge absorption layer may be in a range between 5e13 $cm^{-3}$ and 5e16 $cm^{-3}$, a thickness of the Si waveguide may be in a range between 100 nm and 500 nm, a concentration of intrinsic carriers in the Si waveguide may be in a range between 5e13 $cm^{-3}$ and 5e16 $cm^{-3}$, a thickness of the n-type contact layer may be in a range between 100 nm and 500 nm, a concentration of intrinsic carriers in the n-type contact layer may be in a range between 3e18 $cm^{-3}$ and 3e19 $cm^{-3}$, and a thickness of the BOX layer may be in a range between 1000 nm and 4000 nm.

In some embodiments, a thickness of the compensated region may be in a range between 100 nm and 500 nm, and a concentration of defect-caused p-type may be at least 50% less than that without compensated region.

In some embodiments, a thickness of the p-type contact layer may be in a range between 50 nm and 200 nm, and a concentration of p-type carriers in the p-type contact layer may be in a range between 3e18 $cm^{-3}$ and 3e19 $cm^{-3}$.

Additional Notes

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A photonic device, comprising:

a silicon on insulator (SOI) substrate with a buried oxide (BOX) layer therein;

a Si waveguide and an n-type contact layer formed above the BOX layer in the SOI substrate;

a Si multiplication layer disposed on a first portion of the n-type contact layer;

a p-type Si charge layer formed on the Si multiplications layer;

a germanium (Ge) absorption layer disposed on and directly in contact with the p- type Si charge layer;

a passivation layer disposed on a second portion of the n-type contact layer and the Si waveguide layer;

a p-type contact layer disposed on the Ge absorption layer; and a metal layer disposed on the p-type contact layer, wherein a compensated region is formed between the p-type Si charge layer and the Ge absorption layer with a portion of the compensated region in the p-type Si charge layer and another portion of the compensated region in the Ge absorption layer, and wherein the Si waveguide operates by receiving an incident optical beam in a direction parallel to an interface between the Si waveguide and the SOI substrate.

2. The photonic device of claim 1, wherein the n-type contact layer comprises Si heavily doped with n-type dopants.

3. The photonic device of claim 1, wherein the Si multiplication layer comprises intrinsic Si.

4. The photonic device of claim 1, wherein the p-type Si charge layer comprises Si lightly doped with p-type dopants.

5. The photonic device of claim 1, wherein the Ge absorption layer comprises intrinsic Ge.

6. The photonic device of claim 1, wherein the p-type contact layer comprises amorphous Si heavily doped with p-type dopants.

7. The photonic device of claim 1, wherein the metal layer comprises tungsten or aluminum.

8. The photonic device of claim 1, wherein a thickness of the Ge absorption layer is in a range between 300 nm and 800 nm, and wherein a concentration of intrinsic carriers in the Ge absorption layer is in a range between 1e14 $cm^{-3}$ and 1e16 $cm^{-3}$.

9. The photonic device of claim 1, wherein a thickness of the Si multiplication layer is in a range between 100 nm and 600 nm, and wherein a concentration of intrinsic carriers in the Si multiplication layer is in a range between 5e13 $cm^{-3}$ and 5e16 $cm^{-3}$.

10. The photonic device of claim 1, wherein a thickness of the Si waveguide is in a range between 100 nm and 500 nm, and wherein a concentration of intrinsic carriers in the Si waveguide is in a range between 5e13 $cm^{-3}$ and 5e16 $cm^{-3}$.

11. The photonic device of claim 1, wherein a thickness of the n-type contact layer is in a range between 100 nm and 500 nm, and wherein a concentration of intrinsic carriers in the n-type contact layer is in a range between 3e18 $cm^{-3}$ and 3e19 $cm^{-3}$.

12. The photonic device of claim 1, wherein a thickness of the BOX layer is in a range between 1000 nm and 4000 nm.

13. The photonic device of claim 1, wherein a thickness of the compensated region is in a range between 100 nm and 500 nm, and wherein a concentration of defect-caused p-type in the Ge absorption layer is at least 50% less than that without compensated region.

14. The photonic device of claim 1, wherein a thickness of the p-type contact layer is in a range between 50 nm and 200 nm, and wherein a concentration of p- type carriers in the p-type contact layer is in a range between 3e18 $cm^{-3}$ and 3e19 $cm^{-3}$.

* * * * *